United States Patent [19]
Gullapalli et al.

[11] Patent Number: 5,528,144
[45] Date of Patent: Jun. 18, 1996

[54] INTERLEAVED SLAB INVERSION FOR ENHANCED THROUGHPUT IN FLUID ATTENUATED INVERSION RECOVERY IMAGING

[75] Inventors: Rao P. Gullapalli, Richmond Heights, Ohio; Joseph V. Hajnal, London, England; Haiying Liu, Euclid; Larry Kasuboski, Solon, both of Ohio

[73] Assignee: Picker International, Inc., Highland Heights, Ohio

[21] Appl. No.: 282,621

[22] Filed: Jul. 29, 1994

[51] Int. Cl.⁶ .................................................. G01V 3/00
[52] U.S. Cl. ............................ 324/306; 324/307; 324/309
[58] Field of Search ...................................... 324/307, 309, 324/306

[56] References Cited

U.S. PATENT DOCUMENTS

| | | | |
|---|---|---|---|
| 4,746,865 | 5/1988 | Kasugai | 324/309 |
| 4,761,612 | 8/1988 | Holland | 324/307 |
| 4,845,430 | 7/1989 | Nakabayashi | 324/309 |
| 5,167,232 | 12/1992 | Parker et al. | 324/309 X |

FOREIGN PATENT DOCUMENTS

| | | | |
|---|---|---|---|
| 0398440 | 11/1990 | European Pat. Off. | 324/307 |
| 0497402 | 8/1992 | European Pat. Off. | 324/307 |

OTHER PUBLICATIONS

"Use of Fluid Attenuated Inversion Recovery (FLAIR) Pulse Sequences in MRI of the Brain", Hajnal, et al., Journal of Computer Assisted Tomography, 16(6); 841–844, Nov./Dec. 1992.

Primary Examiner—Walter E. Snow
Assistant Examiner—Mack Haynes
Attorney, Agent, or Firm—Fay, Sharpe, Beall, Fagan, Minnich & McKee

[57] ABSTRACT

An examination region (34) is divided into a multiplicity of slices, e.g. slices 1–20. The slices are divided up into groups or slabs, e.g., slabs I–V. A series of magnetization inversion pulses ($70_I$–$70_V$) and slab select gradient pulses ($74_I$–$74_V$) are applied at regular intervals. At a duration after each slab inversion at which the magnetization of a material such as CSF is at a minimum or null (80) marks a center of a data acquisition period (84). A plurality of imaging sequences (82) are conducted in each data acquisition period. Each of the imaging sequences collects one or more data lines from each of the slices within the corresponding slab. This process is repeated cyclically until all of the data lines of each slice of each slab have been collected. The data lines are reconstructed (102) into an image representation which is stored in an image memory (104) for selective display on a video monitor (108).

9 Claims, 3 Drawing Sheets

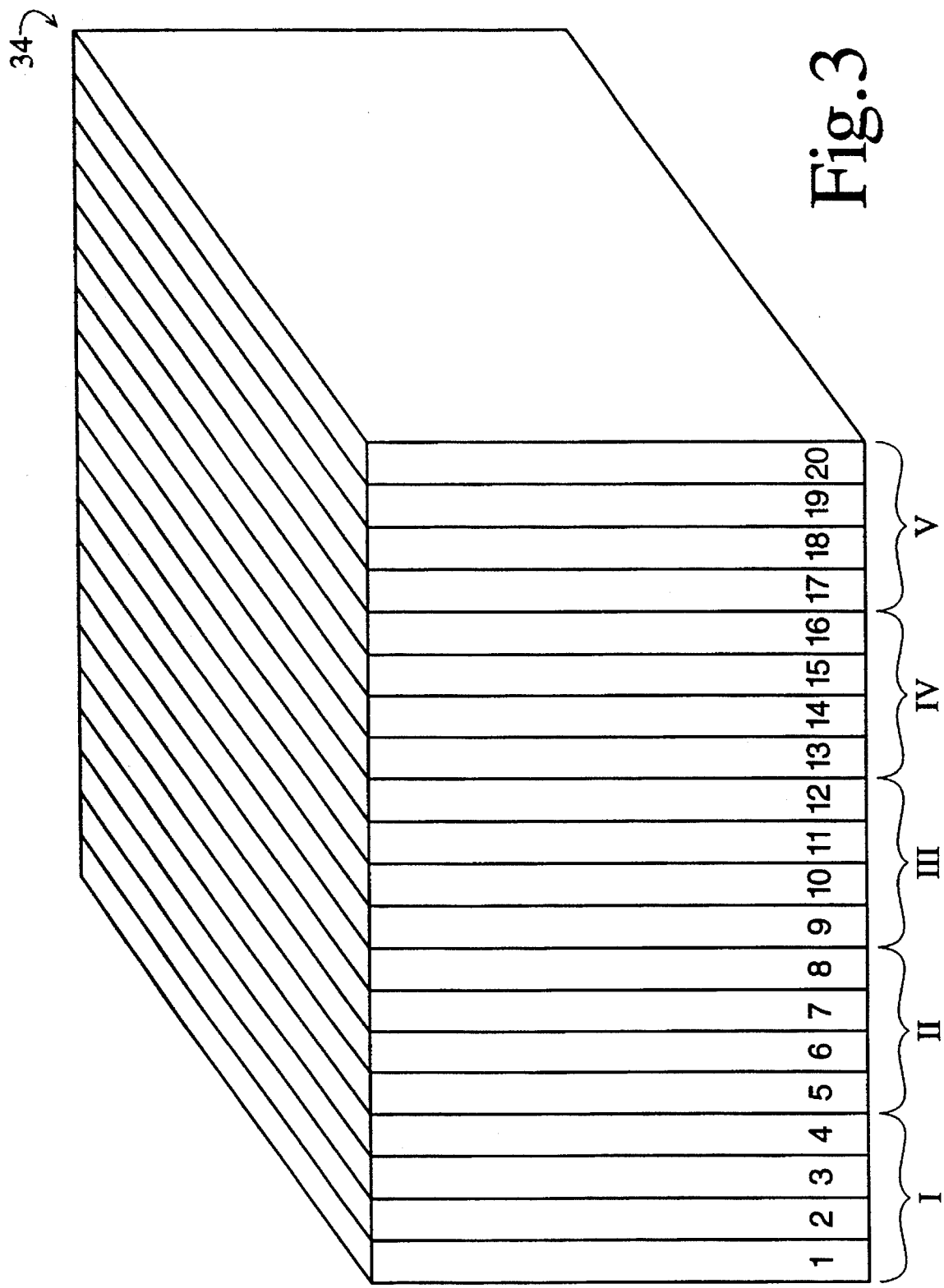

INTERLEAVED SLAB INVERSION FOR ENHANCED THROUGHPUT IN FLUID ATTENUATED INVERSION RECOVERY IMAGING

BACKGROUND OF THE INVENTION

The present invention relates to the magnetic resonance imaging and spectroscopy arts. It finds particular application in conjunction with diagnosing multiple sclerosis plaques and will be described with particular reference thereto. However, it is to be appreciated that the invention will also find application in conjunction with other magnetic resonance imaging techniques, particularly techniques for imaging a first tissue type which is found in close association with a second tissue type that produces a strong magnetic resonance signal.

In conventional magnetic resonance images of the head, the cerebral spinal fluid (CSF) produces a relatively strong magnetic resonance signal, much stronger than the signal from plaques attributable to multiple sclerosis. The plaques are visible in normal T2 weighted images but are partially obliterated by the strong CSF signal.

One way to suppress the CSF signal is to perform an inversion recovery sequence. The CSF has a relatively long T1 relaxation time, on the order of 3,000–4,000 msec. (3–4 seconds). After inversion, the z-component of the T1 magnetization passes through a null or zero point about 0.69 T1 or about 2,000 msec. When an imaging sequence, such as a spin echo sequence, is conducted about 2,000 msec. after application of the inversion, then the contribution of the CSF signal in the line of data acquired from the resultant echo is greatly suppressed relative to plaque contribution. The sequence is commonly repeated about five T1 later to obtain the next data line. Thus, this single line of data per repetition imaging sequence tends to be inordinately slow.

In true inversion time fluid attenuated inversion recovery (FLAIR), data from several slices are interleaved to improve the time needed to acquire a full multi-slice data set. In an example in which each imaging sequence uses 200 msec., then the inversion pulses are applied 200 msec. apart, each inversion is limited to a different slice. 2,000 msec. after the first inversion pulse, the imaging sequence is conducted for the first slice and a first data line is acquired. 2,000 msec. after the second inversion pulse and after collecting image data in the first slice, the imaging sequence is repeated for the second slice and a data line of the second slice is acquired. In this manner, one could obtain data from each of 10 slices (for a 200 msec. data acquisition sequence in 2,000 msec.). Thereafter, a relaxation time of about 4,000 msec. elapses before repeating the procedure to obtain 10 more data lines. With the repetition time of about 6,000 msec., about 13 minutes are required to image 10 slices for a resolution 128×256. For longer imaging sequences than 200 msec., the number of slices is reduced (e.g., 250 msec. sequence; 8 slices) and for shorter imaging sequences than 200 msec., the number of slices is increased (e.g., 166 msec. sequence; 12 slices). One of the problems with this imaging technique is that the inversion pulses tend to be imperfect and invert more than just the intended slice. Accordingly, the slices are gapped by 100% to avoid slice interaction. In a first 6,000 msec. repetition, only data lines from odd numbered slices are collected. In a subsequent 6,000 msec. repetition, only data lines from the intervening even numbered slices are collected. In this manner, 20 slices of image data can be acquired in about 26 minutes.

Relatively true inversion time FLAIR requires a nonselective inversion pulse and then collects as many as about 10 slices after waiting for about 2,000 msec. More specifically, after the inversion pulse, there is a delay of about 1,500 msec. until the commencement of data acquisition. From 1,500 msec. to about 2,500 msec., imaging sequences are repeated and data is collected from each of the above 10 slices. The central slice sees the true inversion time of 2,000 msec. In the other slices, the contribution from the CSF is minimal. The advantage of this scheme over the true inversion time FLAIR is that the slices do not have to be gapped. Ten contiguous slices can be collected. Again, the number of slices decreases with an increase in the TE of the imaging scheme and increases with a decrease in the TE of the imaging scheme. Typically, about 13 minutes are needed to acquire the data for 10 contiguous slices. To cover the whole head with 20 slices, the scan time is doubled.

Thus, both the true inversion time FLAIR and the relatively true inversion time FLAIR suffer from long acquisition times. About a quarter hour is needed to obtain a set of about 10–12 slices and about a half hour for a 20 slice set. See "Use of Fluid Attenuated Inversion Recovery Pulse Sequences in MRI of the Brain", Hajnal, et al., J. Comput. Assist. Tomogr. 16 (6), p. 841, (1992).

The present invention contemplates a new and improved magnetic resonance imaging technique and apparatus which overcomes the above referenced problems and others.

SUMMARY OF THE INVENTION

In accordance with the present invention, a magnetic resonance imaging technique is provided. A series of inversion pulses are applied at regular intervals to initiate inversion recovery in slabs. When the tissue to be suppressed approaches its zero or null point in each slab, a series of magnetic resonance echo sequences are run to collect data from a plurality of slices in that slab.

In accordance with a more limited aspect of the present invention, the inversion recovery is initiated serially in the plurality of slabs in such a sequence that inversion recovery is not excited in adjacent slabs temporally contiguously.

In accordance with another aspect of the present invention, only a small number of magnetic resonance echo sequences are conducted in each slab such that all of the magnetic resonance data is taken very close to the suppressed material inversion null point.

A primary advantage of the present invention resides in its higher throughput.

Another advantage of the present invention is that more slices of data can be obtained per unit time.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
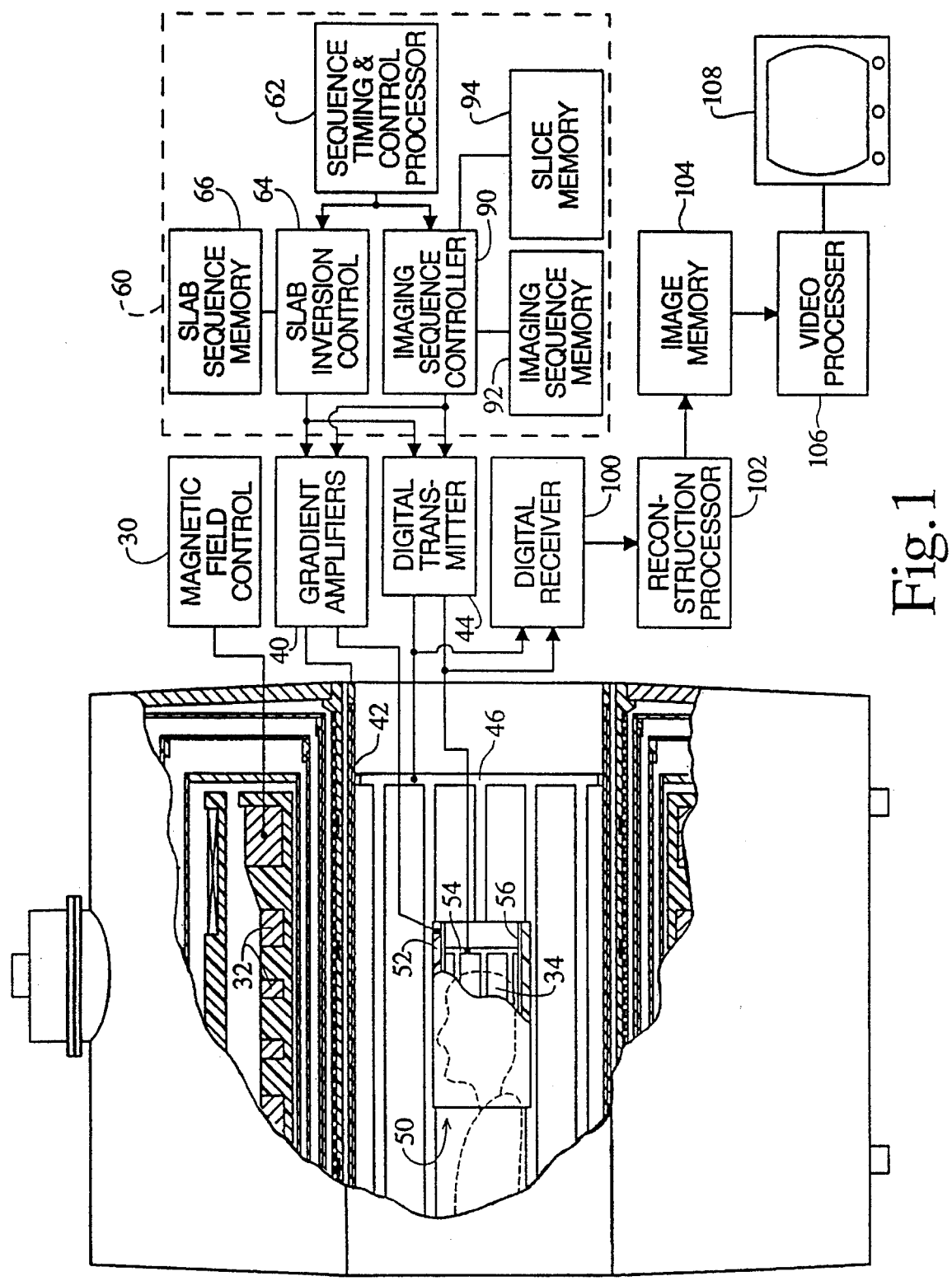
FIG. 1 is a diagrammatic illustration of a magnetic resonance imaging apparatus in accordance with the present invention.

With reference to FIG. 1, a main magnetic field control 30 controls superconducting or resistive magnets 32 such that a substantially uniform, temporally constant magnetic field is created along a z-axis through an examination region 34. A magnetic resonance echo means applies a series of radio frequency (RF) and magnetic field gradient pulses to invert or excite magnetic spins, induce magnetic resonance, manipulate magnetic resonance, spatially and otherwise encode the magnetic resonance, and the like to bring about magnetic resonance imaging and spectroscopy sequences. More specifically, gradient pulse amplifiers 40 apply current pulses to selected ones or pairs of whole body gradient coils 42 to create magnetic field gradients along x, y, and z-axes of the examination region 34. A digital radio frequency transmitter 44 transmits radio frequency pulses or pulse packets to a whole body RF coil 46 to transmit RF pulses into the examination region. A typical radio frequency pulse is composed of a packet of immediately contiguous pulse segments of short duration which taken together achieve a selected magnetic resonance manipulation. The RF pulses are used to saturate, excite resonance, invert magnetization, or manipulate resonance in selected portions of the examination region. For whole body applications, the resonance signals are commonly picked up by the whole body RF coil 46.

For generating images of the brain, an insertable head coil 50 is preferably inserted surrounding the examination region at the isocenter of the bore. The insertable head coil includes local gradient coils 52 which receive current pulses from the gradient amplifiers 40 to create magnetic field gradients along x, y, and z-axes in the examination region within the head coil. A local radio frequency coil 54 is used to excite magnetic resonance and receive magnetic resonance signals emanating from the patient's head. An RF screen 56 blocks the RF signals from RF head coil from reaching the RF gradient coils and inducing eddy currents therein.

A sequence control means 60 controls the gradient pulse amplifiers 40, the digital transmitter 44, and the digital radio frequency receiver 48. More specifically, the sequence control means includes a sequence timing and control processor 62 which provides the basic timing signals for the magnetic resonance imaging sequence. A slab inversion control 64 is clocked by the sequence timing and control processor 62 to invert the magnetization in selected slabs of the examination region. A slab sequence memory 66 provides for a plurality of slab sequences among which the operator can choose.

Figure 2:
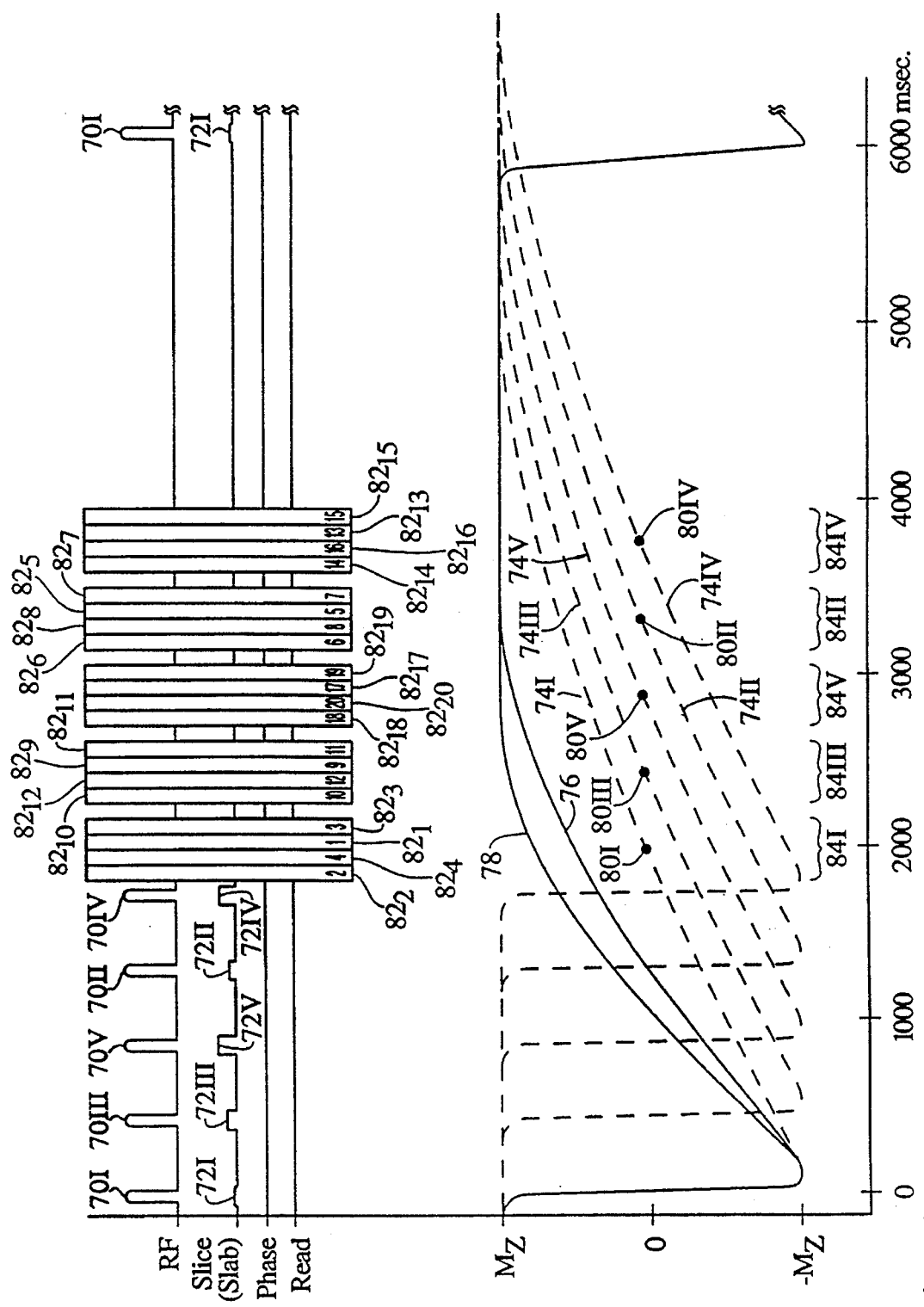
FIG. 2 is a timing diagram of a preferred imaging sequence in conjunction with magnetization inversion and recovery; and, FIG. 3 illustrates the slices and slabs of the examination region of an illustrated preferred embodiment.

With continuing reference to FIG. 1 and further reference to FIG. 2, the slab inversion processor 64 causes the digital transmitter 44 to apply a slab invert RF pulse 70 at regular intervals, e.g. 400 msec. intervals. The slab inversion control 64 further causes the gradient amplifiers 40 to create a slice select pulse 72, or more accurately a slab select pulse, concurrently with each slab inversion pulse 70. The slab select pulses 52 act together to cause but limit the inversion of magnetization to a selected volume or slab.

FIG. 3 illustrates one embodiment in which twenty slices 1–20 are imaged. By adjusting the slab select gradient pulses 72 from repetition to repetition, the magnetization of different slabs or groups of slices are inverted. More specifically to the preferred embodiment, adjacent slabs are not inverted right after each other. Rather, alternate slabs I, III, and V are inverted and then even slabs II and IV. By inverting only alternate slabs, the slab select gradient need not be as accurate. The inverted magnetization region can extend into the slabs between the two temporally contiguously inverted slabs without interference. Other sequences in which physically adjacent slabs are not inverted temporally adjacent are also contemplated.

With reference again to FIG. 2, the slab inversion RF pulse $70_I$ and gradient pulse $72_I$ causes the magnetization $M_z$ $74_I$ in slab I to be inverted to a magnetization $-M_z$. The magnetization then relaxes back to the $M_z$ level over a period of time, crossing the zero axis at about 0.693 T1. In the preferred embodiment, the relaxation curve for CSF crosses the zero axis at about 2,000 msec. after inversion. Other tissue whose T1 has different relaxation times, such as gray matter 76 or white matter 78 relax back to the initial magnetization level at different rates. It will be observed that at 2,000 msec. where the CSF magnetization is substantially at its zero or null point 80, there is significant white and gray matter magnetization. Thus, when an echo sequence 82, such as a spin echo, echo-planar imaging, or other echo sequence is run at 2,000 msec., the CSF fluid has substantially no magnetization and contributes substantially no magnetic resonance signal. The white and gray matter, however, have a much more significant contribution to the magnetic resonance signal. Further, in a temporal window 84 to either side of the CSF null point 80, the CSF magnetization is still small relative to white and gray matter magnetization. Of course, the window 84 can be expanded or contracted as is appropriate to the amount of CSF contribution that is deemed acceptable.

The slab inversion pulses 70 are spaced apart by substantially the window 84. Within the window 84, a plurality of echo sequences 82 are conducted. For an imaging sequence with a TE time of about 90 msec., four repetitions of the imaging sequence can be fit within a 400 msec. window. With faster imaging sequences or larger windows, more repetitions of the imaging sequence per window are permitted. In the illustrated example, imaging sequences $82_2$, $82_4$, $82_1$, and $82_3$ are performed to collect a data line from each of slices 2, 4, 1, and 3 respectively. Note that it is preferred that data from physically contiguous slices be collected at temporally displaced intervals.

In the imaging window $84_{III}$ that is centered 2,000 msec. after the RF inversion pulse $70_{III}$ and slab select gradient $74_{III}$, imaging sequences $82_{10}$, $82_{12}$, $82_9$, and $82_{11}$ are conducted to collect a data line in each of slices 10, 12, 9, and 11, respectively. This process is repeated for the slices in slabs V, II, and IV, respectively. After the last slab, a recovery period of about 2,000 msec. is provided. More specifically, the sequence is restarted by applying a slab I inversion pulse 6,000 msec. after the first slab I inversion pulse.

With reference again to FIG. 1, the sequence and control means 60 includes an imaging sequence controller 90 which controls the digital transmitter 44 and the gradient amplifiers 40 to implement a selected imaging sequence. A memory 92 stores a plurality of selectable imaging sequences such as echo-planar imaging sequences, spin echo, gradient echo, and the like. A slice counter or memory 94 controls an order within which data is collected with the selected imaging sequence.

A typical spin echo imaging sequence includes a 90° excitation pulse applied concurrently with a slice select gradient. This combination of RF excitation and slice select pulse limits the imaging sequence to the selected slice within the slab. A phase encode gradient pulse encodes the phase of the resultant magnetic resonance signal. A 180° pulse refocuses the magnetization excited by the 90° excitation pulse in the selected slice causing a magnetic resonance echo. A read gradient is applied concurrently with the magnetic resonance echo to provide frequency encoding. A slice select gradient reversal sequence in which the 90° pulse is reversed relative to the 180° pulse suppresses the contribution of fat and other materials in addition to CSF. Slice select gradient reversal sequences also suppress chemical shift artifacts. Although spin echo sequences are preferred, other imaging sequences such as FSE, FAME, GRASE, and other k-space manipulation techniques are also be contemplated.

The magnetic resonance echoes are received and demodulated by a digital receiver 100. An image reconstruction processor 102 reconstructs the data lines in the data memory into an image representation that is stored in an image memory 104. In the preferred embodiment, the image reconstruction processor uses a two-dimensional inverse Fourier transform reconstruction technique to transform the data lines of each slice into a series of two-dimensional image representations. However, other magnetic resonance imaging reconstruction techniques, as are known in the art, may also be utilized. A video processor 106 converts selected portions of the three-dimensional image representation in the image memory 104 into appropriate format for display on a video monitor 108

Other combinations of slabs and slices are, of course, contemplated. For a 20 slice image, one can cyclically invert four slabs, with five slices in each slab. One could also invert ten slabs with two slices per slab. With a multiple echo sequence, one can obtain a plurality of data lines from each slice. Further, other numbers of total slices suggest other patterns. For example, a 24 slice image can be generated from 4 slabs of 6 slices each, 6 slabs of 4 slices each, 8 slabs of 3 slices each, 12 slabs of 2 slices each, etc.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In an inversion recovery magnetic resonance imaging method in which (a) a subject region including a first material to be suppressed and a second material to be emphasized to be imaged is disposed in an examination region of a temporally constant magnetic field, (b) magnetization of the first and second materials in a portion of the region is inverted, (c) resonance data is collected generally as the magnetization of the first material crosses a null or minimum, (d) an inversion recovery time is provided, (e) steps (b)–(d) are repeated to collect a multiplicity of resonance data, (f) the multiplicity of resonance data are reconstructed into a three-dimensional image representation, and (g) selected portions of the three-dimensional image representation are converted into a human readable display, THE IMPROVEMENT COMPRISING:

(1) inverting the magnetization sequentially in each of a plurality of slabs;

(2) after inverting the magnetization in the plurality of slabs, in each slab generally as the magnetization of the first material crosses the null or minimum, collecting resonance data sequentially from each of a plurality of slices within the slab.

2. An inversion recovery magnetic resonance imaging method comprising:

(a) at regular intervals, cyclically inverting magnetization of a first material whose contribution is to be suppressed and a second material whose contribution is to be emphasized in each of a plurality of slabs within an examination region, each slab including a plurality of slices;

(b) following a plurality of slab inversions generally as the magnetization of the first material in each slab recovers to near a null or minimum, repeatedly applying a magnetic resonance imaging sequence to generate resonance data from each of the plurality of slices within each slab;

(c) reconstructing the resonance data into a multi-slice image representation.

3. The method as set forth in claim 2 wherein the inverting of the magnetization in physically adjacent slabs is performed at temporally displaced intervals.

4. The method as set forth in claim 2 further including repeating step (a) for first, third, and fifth slabs which are physically displaced from each other by second and fourth slabs;

as the first material magnetization in the first slab approaches the null, collecting resonance data from each of a plurality of slices within the first slab;

as the first material magnetization in the third slab approaches the null, collecting resonance data from each of a plurality of slices within the third slab;

as the first material magnetization in the fifth slab approaches the null, collecting resonance data from each of a plurality of slices within the fifth slab.

5. The method as set forth in claim 4 further including:

inverting the magnetization in the second and fourth slabs;

as the first material magnetization in the second slab approaches the null, collecting resonance data from each of a plurality of slices within the second slab;

as the first material magnetization in the fourth slab approaches the null, collecting resonance data from each of a plurality of slices within the fourth slab.

6. The method as set forth in claim 5 wherein the steps of collecting resonance data include applying a 90° excitation radio frequency pulse with a slice select gradient followed by a 180° refocusing radio frequency pulse to refocus excited magnetization into an echo, the 90° excitation radio frequency pulse being reversed relative to the 180° refocusing radio frequency pulse.

7. A magnetic resonance imaging apparatus comprising:

magnets for creating a temporally constant magnetic field through an examination region;

a radio frequency coil disposed around the examination region for transmitting radio frequency signals into the examination region and receiving magnetic resonance signals emanating from the examination region;

a transmitter connected with the radio frequency coil for supplying radio frequency pulses thereto;

a plurality of gradient coils disposed around the examination region for creating magnetic field gradients across the examination region;

gradient pulse amplifiers connected with the gradient coils for applying current pulses to the gradient coils for selectively creating magnetic field gradient pulses across the examination region;

a slab inversion control connected with the transmitter and the gradient amplifiers for selectively and sequentially inverting magnetization of a first material whose contribution is to be suppressed and a second material whose contribution is to be emphasized within each of a plurality of multi-slice slabs of the examination region;

an imaging sequence control connected with the transmitter and the gradient amplifiers for, after magnetization has been inverted in each of the slabs, repeatedly applying a plurality of imaging sequences generally as the magnetization of the first material in each slab recovers to near a null or minimum, to generate lines of resonance data from the second material in each of a plurality of slices of each slab;

a receiver for receiving the resonance data lines from the radio frequency coil;

an image reconstruction processor for reconstructing the received resonance data lines into an electronic image representation;

a memory for storing the electronic image representation;

a video processor for retrieving selected portions of the electronic image representation from the electronic image representation memory and converting the selected portions into appropriate format for display on a monitor.

8. The magnetic resonance apparatus as set forth in claim 7 further including:

an imaging sequence memory for storing a plurality of imaging sequences, the imaging sequence memory being connected to the imaging sequence control such that the imaging sequence control can apply any of the plurality of stored image sequences.

9. The method as set forth in claim 3 wherein the inverting of the magnetization in physically adjacent slabs at temporally displaced intervals includes inverting the magnetization in physically displaced slabs temporally contiguously such that materials at an interface between the two physically adjacent slabs is not inverted twice in succession.

* * * * *